US010931067B2

(12) United States Patent
Goebel et al.

(10) Patent No.: US 10,931,067 B2
(45) Date of Patent: Feb. 23, 2021

(54) COMMON MODE CHOKE

(71) Applicant: HOLLAND ELECTRONICS, LLC, Ventura, CA (US)

(72) Inventors: George Goebel, Camarillo, CA (US); Michael Holland, Santa Barbara, CA (US); Michael Bott, Ventura, CA (US); John Chrostowski, Ventura, CA (US)

(73) Assignee: HOLLAND ELECTRONICS, LLC, Ventura, CA (US)

( * ) Notice: Subject to any disclaimer, the term of this patent is extended or adjusted under 35 U.S.C. 154(b) by 0 days.

(21) Appl. No.: 16/171,803

(22) Filed: Oct. 26, 2018

(65) Prior Publication Data

US 2020/0099178 A1   Mar. 26, 2020

Related U.S. Application Data

(60) Provisional application No. 62/735,557, filed on Sep. 24, 2018.

(51) Int. Cl.
| | |
|---|---|
| *H01R 13/7193* | (2011.01) |
| *H03H 7/42* | (2006.01) |
| *H04N 7/173* | (2011.01) |
| *H02G 15/02* | (2006.01) |
| *H04B 1/40* | (2015.01) |
| *H01F 17/00* | (2006.01) |

(52) U.S. Cl.
CPC ....... *H01R 13/7193* (2013.01); *H02G 15/025* (2013.01); *H03H 7/427* (2013.01); *H04B 1/40* (2013.01); *H04N 7/17309* (2013.01); *H01F 2017/0093* (2013.01)

(58) Field of Classification Search
CPC .......... H04B 1/10; H04B 1/1027; H04B 1/38; H04B 1/40; H01F 2017/0093; H01R 13/6581; H01R 13/6591; H01R 13/719; H01R 13/7193; H01R 24/38; H02G 15/025; H04H 7/427; H04N 7/17309; H04N 7/17318; H04N 7/17327; H03H 7/427
USPC ........ 375/219, 220, 222, 346, 350; 455/572, 455/575.1, 338–340; 725/111
See application file for complete search history.

(56) References Cited

U.S. PATENT DOCUMENTS

| | | | | |
|---|---|---|---|---|
| 2010/0095344 A1* | 4/2010 | Newby | ............... | H04N 21/6118 725/125 |
| 2013/0067525 A1* | 3/2013 | Wang | ................... | H04N 17/004 725/111 |
| 2015/0078756 A1* | 3/2015 | Soto | ..................... | H04B 10/808 398/116 |
| 2015/0142345 A1* | 5/2015 | Anderson | .............. | H04H 20/12 702/59 |

* cited by examiner

*Primary Examiner* — Young T. Tse
(74) *Attorney, Agent, or Firm* — Paul D. Chancellor; Ocean Law

(57) ABSTRACT

A cable distribution plant is protected from noise where a modem housing encloses a switching power supply and digital electronics, the modem switching power supply for receiving AC mains power via an EMI filter and modem digital electronics for receiving a switching power supply output via an LC filter for filtering noise at the switching power supply frequency wherein multiple filters used with respective modems at subscriber sites protect the head-end from switching power supply harmonic noise otherwise aggregated by the nodes and passed to the head end.

15 Claims, 12 Drawing Sheets

Cable Distribution Plant View 1

Cable Distribution Plant View 1

Cable Distribution Plant View 2

Cable Distribution Plant View 3

Cable Modem

Power Rail Interconnection

Cable Distribution Plant With Noise Protection

Auxiliary Filter 1

Embodiment of Auxiliary Filter 1

Filter 1 Response

Auxiliary Filtering Device 2

Auxiliary Filtering Device 3

Auxiliary Filtering Device 4

Auxiliary Filtering Device 5

Ferrite Filter

Isolating Filter View 1

Isolating Filter View 2

COMMON MODE CHOKE

PRIORITY

This application claims the benefit of provisional patent application 62/735,557 filed Sep. 24, 2018 entitled Common Mode Choke.

BACKGROUND OF THE INVENTION

Field of the Invention

The present invention relates to an article of manufacture for attenuating electrical signals. In particular, a device prevents unwanted and/or spurious signals from propagating upstream in a cable distribution system serving subscribers via coaxial cable.

Discussion of the Related Art

Filters are well-known devices for eliminating noise in electrical circuits. In the cable television industry, these well-known filters are typically placed inside electrical enclosures such as modem boxes. These filter(s) assure that noise leaving the box is within acceptable limits considering operation of subscriber equipment and considering operation of the cable distribution plant. Distribution of modem box filters to include filters inside the box and outside the box are not well-known.

SUMMARY OF THE INVENTION

The present invention provides a noise protection for a cable distribution plant.

In an embodiment a cable distribution system includes devices for attenuating noise propagating upstream from multiple subscriber sites toward a head end, the noise attenuating devices including a distributed cable modem filter and comprising: plural subscriber sites served by a cable distribution system node and plural nodes served by a cable distribution system head end; each subscriber site including an AC mains powered modem interconnected with the node via a coaxial cable and each node interconnected with the head end via an optical fiber; a modem transceiver receiving a broadcast signal originating from the cable distribution system and transmitting a signal to one of a television front end and a computer; within a modem housing a switching power supply receiving AC mains power via an EMI filter and digital electronics receiving a switching power supply output via an LC filter for filtering noise at a switching power supply frequency; and, external to the modem housing and integrated with the coaxial cable, a discrete component filter for filtering noise at harmonics of the switching power supply frequency, the noise carried by one or both of the coaxial shield and the coaxial center conductor; wherein the discrete component filters used with respective modems at subscriber sites protect the head end from switching power supply harmonic noise otherwise aggregated by the nodes and passed to the head end.

In some embodiments the system further comprises within the discrete component filter, a micro coaxial cable coiled around a ferrite in the form of a toroid; and. a metal sleeve around the cable and ferrite, the metal sleeve contacting a coaxial connector at one end of the filter but disconnected from a coaxial connector at the other end of the filter.

In some embodiments the system micro-coaxial cable has a braid shield and a foil shield. And, in some embodiments the system is influenced by capacitive effects owing to use of 1.5 mm diameter micro-coaxial cable coiled about a ferrite contribute to filter response that is about flat between 15 and 35 MHz.

BRIEF DESCRIPTION OF THE DRAWINGS

The present invention is described with reference to the accompanying figures. These figures, incorporated herein and forming part of the specification, illustrate embodiments of the invention and, together with the description, further serve to explain its principles enabling a person skilled in the relevant art to make and use the invention.

DESCRIPTION OF THE PREFERRED EMBODIMENTS

The disclosure provided herein describes examples of some embodiments of the invention. The designs, figures, and descriptions are non-limiting examples of the embodiments they disclose. For example, other embodiments of the disclosed device and/or method may or may not include the features described herein. Moreover, disclosed advantages and benefits may apply to only certain embodiments of the invention and should not be used to limit the disclosed invention.

Figure 1A:
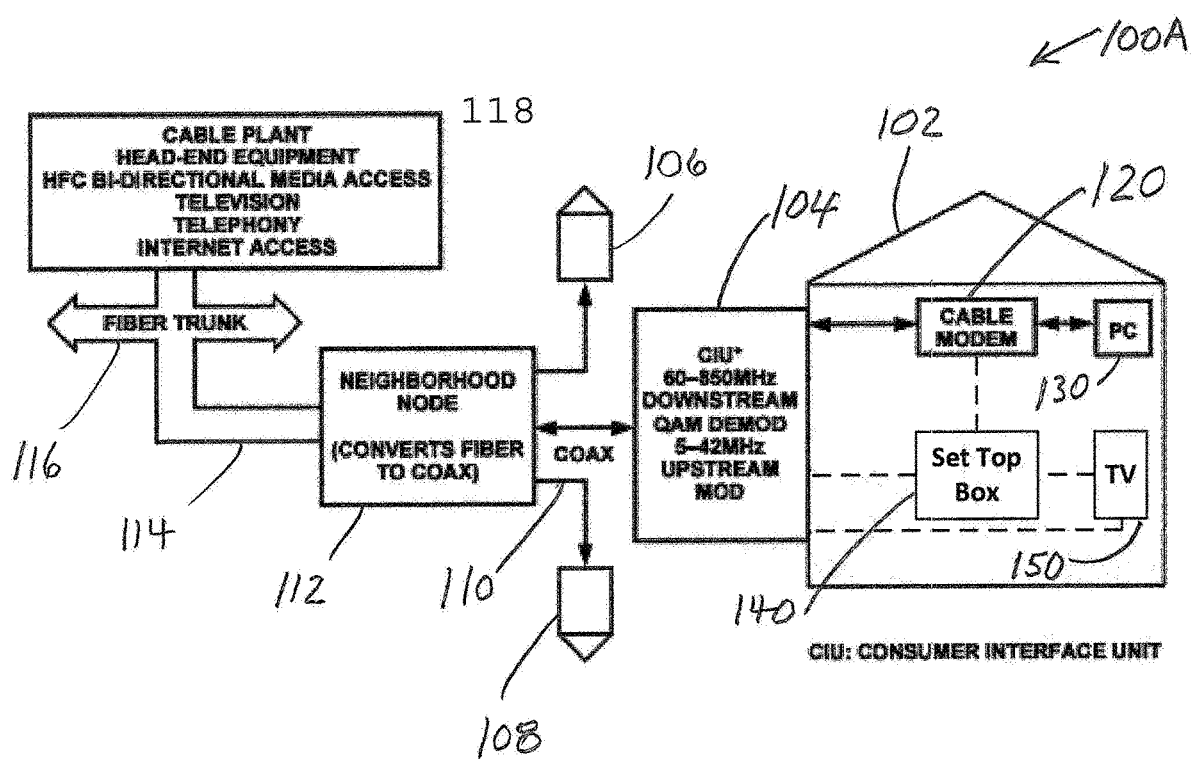
FIG. 1A shows a cable distribution plant.

FIG. 1A shows a cable distribution plant 100A such as may be used for distributing television and/or internet services. The cable plant includes a head end 118 interconnected to a distribution node 112 via optical fiber 114. The optical fiber interconnects multiple distribution nodes 112 and each node supports multiple subscriber sites 102.

Subscriber sites 102, 106, 108 connect to a node via coaxial cable 110. Signals from the head end 118 provide subscriber sites with a television service and/or an internet service via the nodes. For example, each subscriber site may include a cable modem 120 connected to a node via a coaxial cable. And, the cable modem may provide for interconnecting a subscriber site computer 130 with the head end.

It should be noted that, for clarity, downstream communications are shown taking place from the head end 118 and a fiber trunk 116 to the subscriber 102. However, upstream communication from the subscriber 102 to the head end 118 may also take place. For example, communications upstream may result from 1) computer 130 entries or 2) TV related commands received from a TV 150 or from a set top box 140 (TV front end).

Figure 1B:
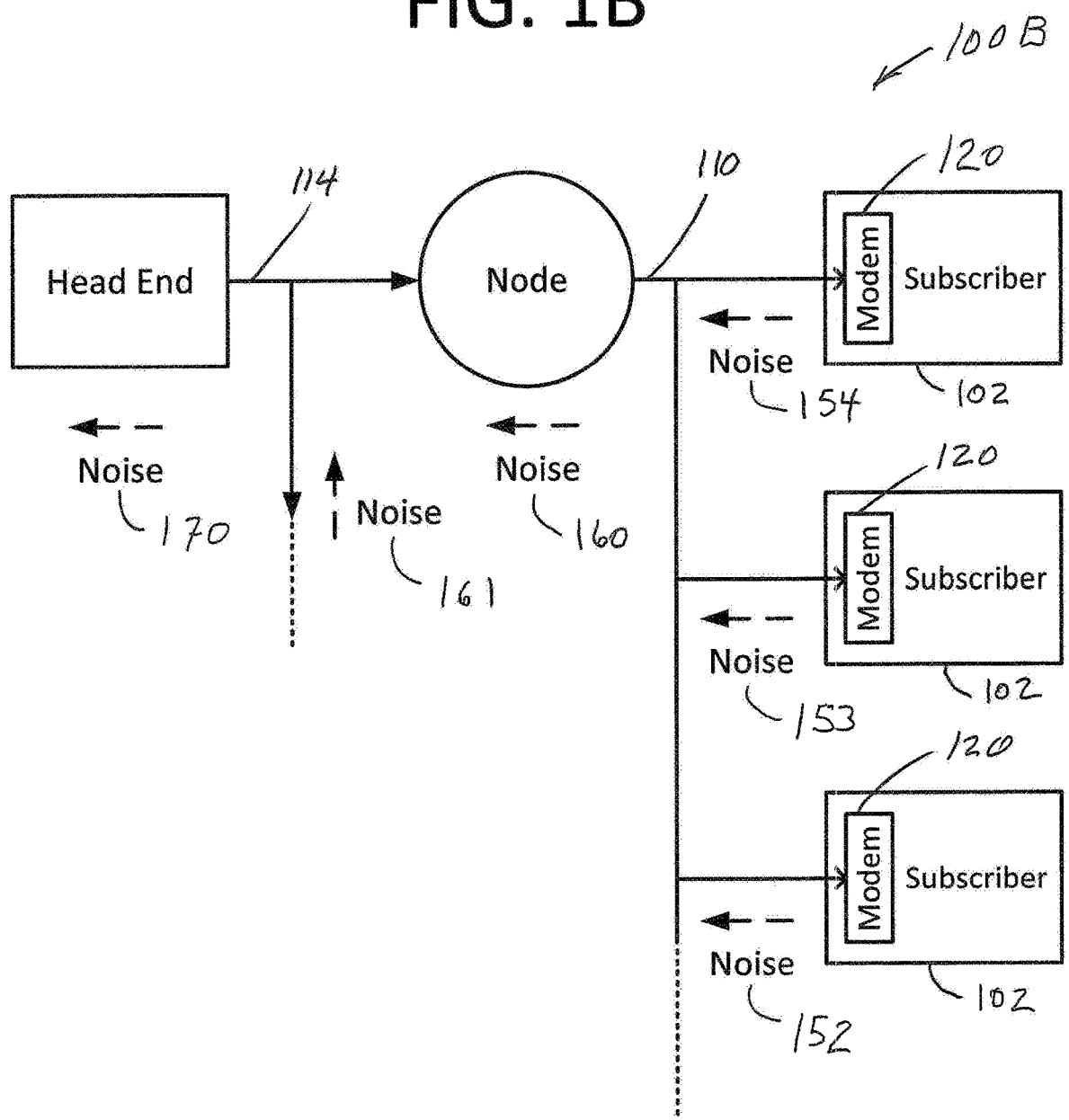
FIG. 1B shows another view of a cable distribution plant.

FIG. 1B shows another view of the cable distribution plant 100B. The cable plant includes an optical fiber 114 interconnecting a head end 118 and a node. Multiple subscribers 102 are served from the node via coaxial cable 110 which terminates at devices including subscriber modems 120.

In this cable distribution plant 100B noise 152-154 is shown moving upstream from the modems 120. This subscriber site noise may be aggregated 160 at the node. And, where there are multiple additional nodes (see e.g., FIG. 1A), noise from these additional nodes 161 adds with the noise 160 and is aggregated 170 at the head end.

Figure 2A:
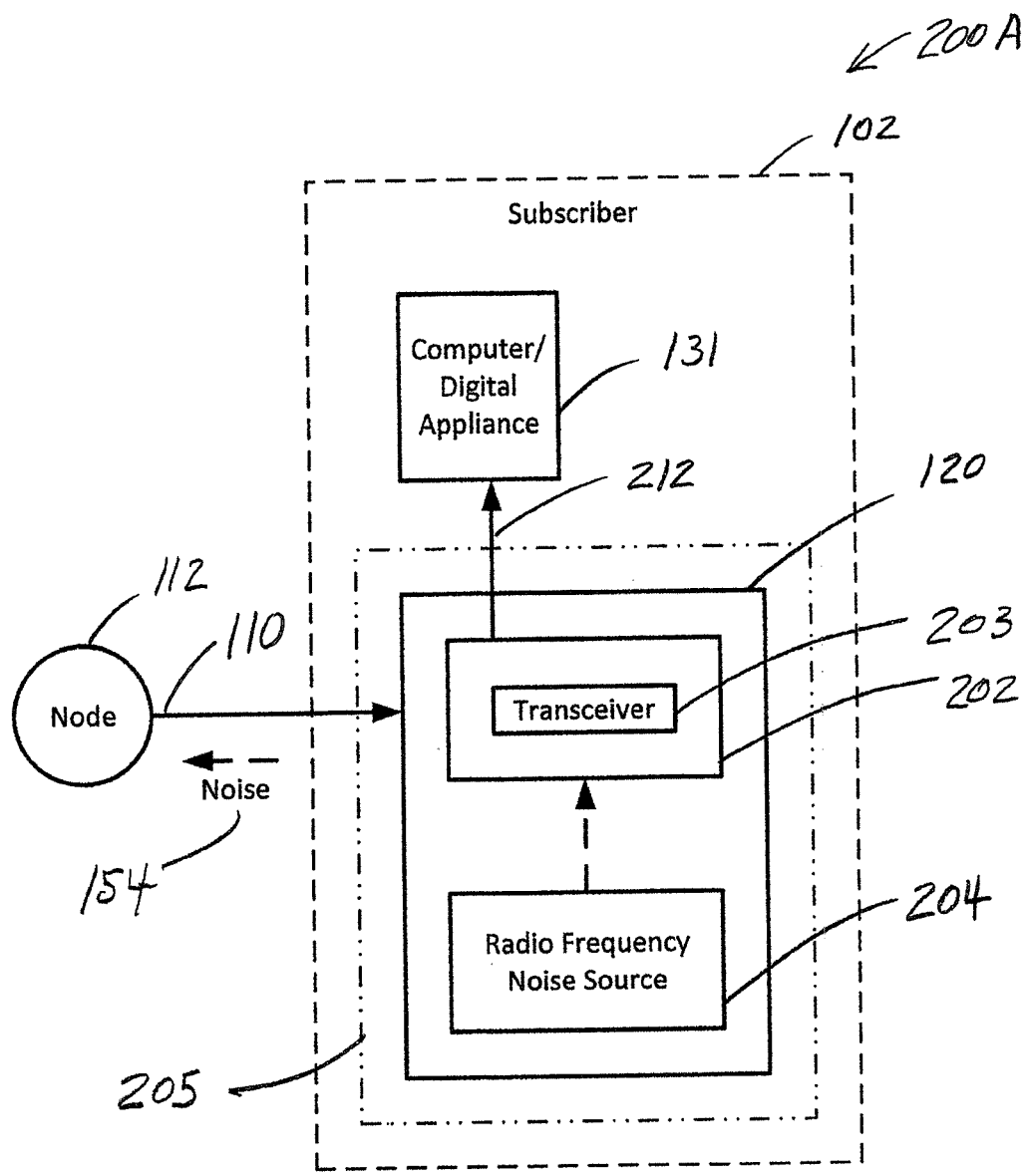
FIG. 2A shows yet another view of a cable distribution plant.

FIG. 2A shows another view of the cable distribution plant 200A. Here, a modem 120 is connected between a computer/digital appliance 131 and a node 112. Coaxial cable 110 interconnects the node and the modem and a data cable 212 such as Ethernet interconnects the modem and a computer/digital appliance 131.

Within the modem 120 is a radio frequency noise source 204 and digital electronics 202. The digital electronics includes a modem transceiver 203. As shown, noise 154 originates with subscriber modems 120. In various embodiments, a modem housing/enclosure 205 encloses the digital electronics and the radio frequency noise source. In various embodiments a coaxial connector such as a coaxial port protrudes from the housing. And in various embodiments an AC mains power cord terminates at the housing.

It is noted that a cable modem filter may be distributed. That is, the modem filter may include components/filters internal to the cable modem housing/enclosure and components/filters external to the cable modem housing/enclosure.

Figure 2B:
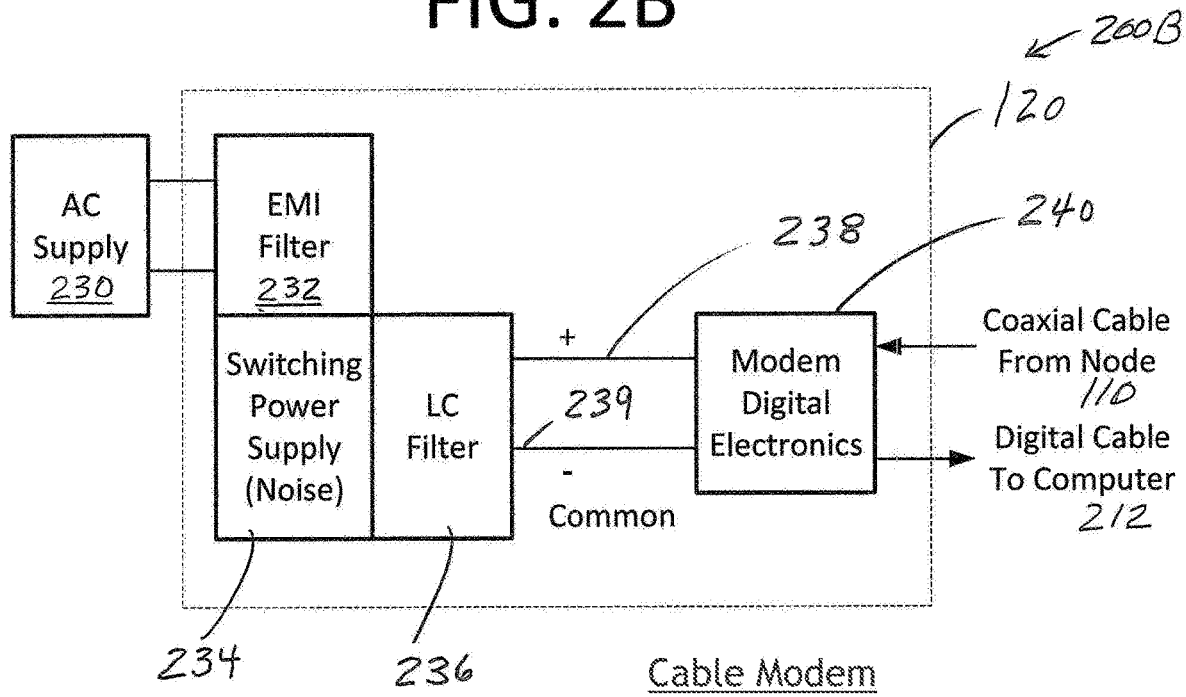
FIG. 2B shows a cable modem block diagram.

FIG. 2B shows a modem block diagram 200B. As seen, the modem includes digital electronics 240 powered by a switching power supply 234. In particular, an AC power source 230 such as AC mains power source provides power to the switching power supply via an EMI (Electromagnetic Interference) filter 232. An LC (inductor/capacitor) filter 236 follows the switching power supply. Positive 238 and negative (common) 239 LC filter outputs which may be referred to as rails or power rails provide DC power to the digital electronics 240.

Figure 2C:
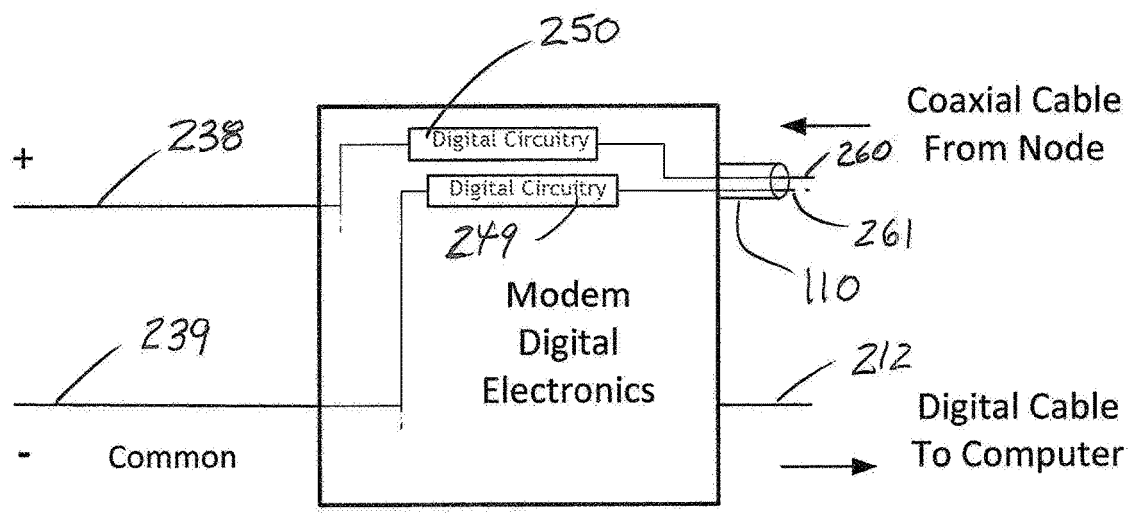
FIG. 2C shows a power rail interconnection with a coaxial cable.

FIG. 2C shows a power rail interconnection with the coaxial cable 200C. As mentioned, the digital electronics interconnects with the positive and negative/common power rails of the LC filter. Embodiments may include digital circuitry 249, 250. Digital electronics circuitry 249 may provide a current path between power rail 239 and the coaxial cable 110. And, digital electronics circuitry 250 may provide a current path between power rail 238 and the coaxial cable 110.

In an embodiment, digital electronics circuitry 249 provides a current path between power rail 239 and a center conductor 260 of coaxial cable 110. And, in an embodiment digital electronics circuitry 250 provides a current path between power rail 238 and the ground sheath 261 of coaxial cable 110. In some embodiments, both of these current paths exist.

Figure 3:
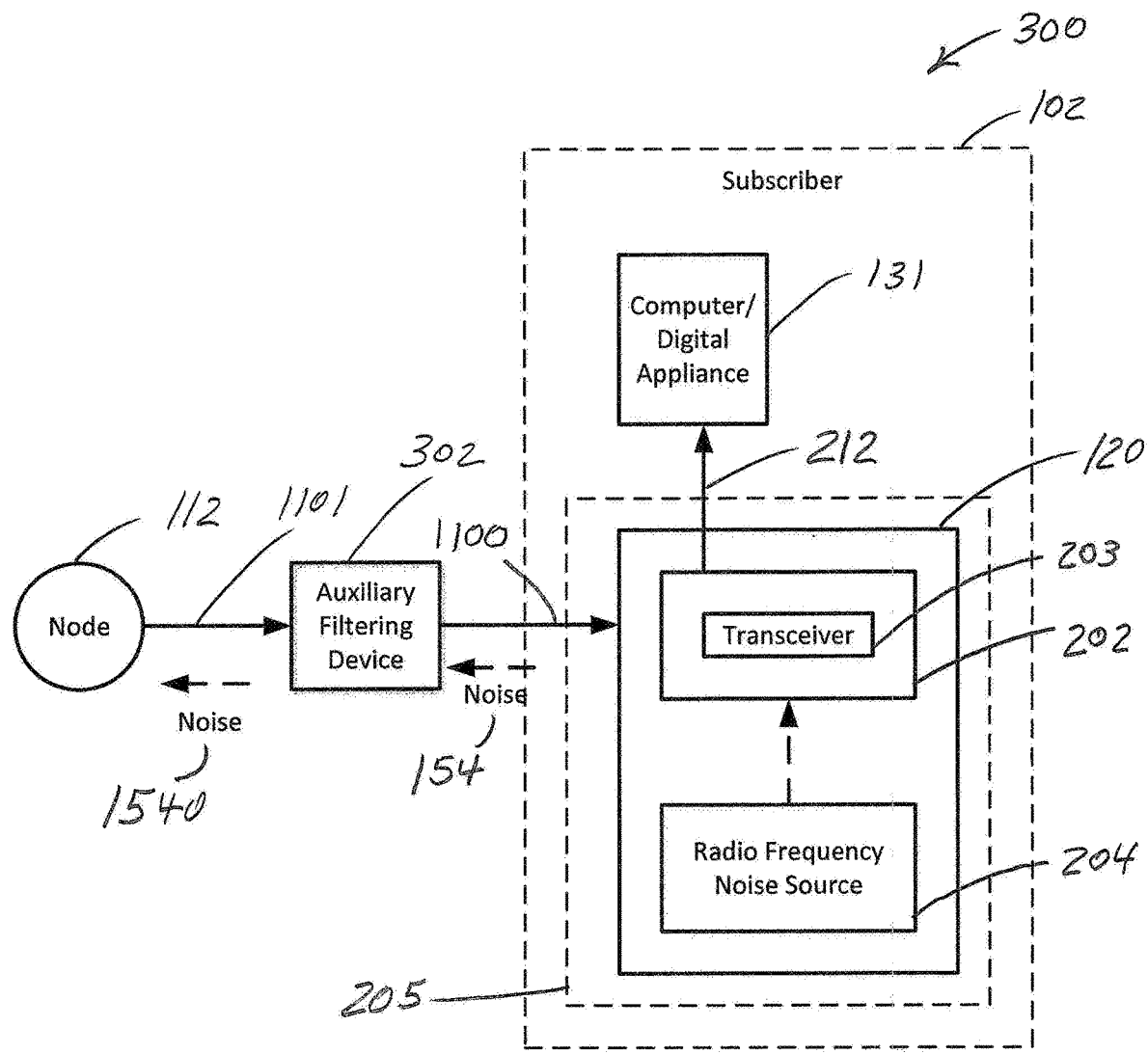
FIG. 3 shows a cable distribution plant with noise protection.

FIG. 3 shows another view of the cable distribution plant 300. This plant is similar to the cable distribution plant of FIG. 2A. However, here an auxiliary filtering device 302 is located between the modem 120 and the node 112.

In various embodiments, the auxiliary filtering device 302 interconnects the shields of the coaxial cables 1100, 1101. In various embodiments, the auxiliary filtering device 302 interconnects the center conductors of coaxial cables 1100, 1101. And in various embodiments, the auxiliary filtering device 302 interconnects both the shields and the center conductors of coaxial cables 1100, 1101. Where the auxiliary filtering device 302 is connected directly to a modem port, for example using a male F type connector, annotated item 1100 is the modem port/coaxial connector.

The auxiliary filtering device 302 may augment the filtering capacity of the modem's internal LC filter 236. In particular, the LC filter may be designed to provide filtering at or primarily at the frequency of the switching power supply, for example at switching frequencies between 500 KHz to 2 MHz. And, the auxiliary filter may be designed to provide filtering at or primarily at harmonics of the switching frequency, for example in the 2 to 50 MHz range or in a range below 51 MHz.

In this manner, the LC filter 236 and auxiliary filtering device 302 work together to filter the switching power supply noise. Here, the modem digital electronics are protected from switching power supply noise by the LC filter and the head end 118 is protected from switching power supply noise by the auxiliary filtering device.

Notably, the LC filter 236 may be in a modem housing 205 while the auxiliary filtering device 302 may be located outside the modem housing. And notably, the LC filter is between the switching power supply 234 and the modem digital electronics 240 while the auxiliary filtering device is between the modem and a node.

Figure 4A:
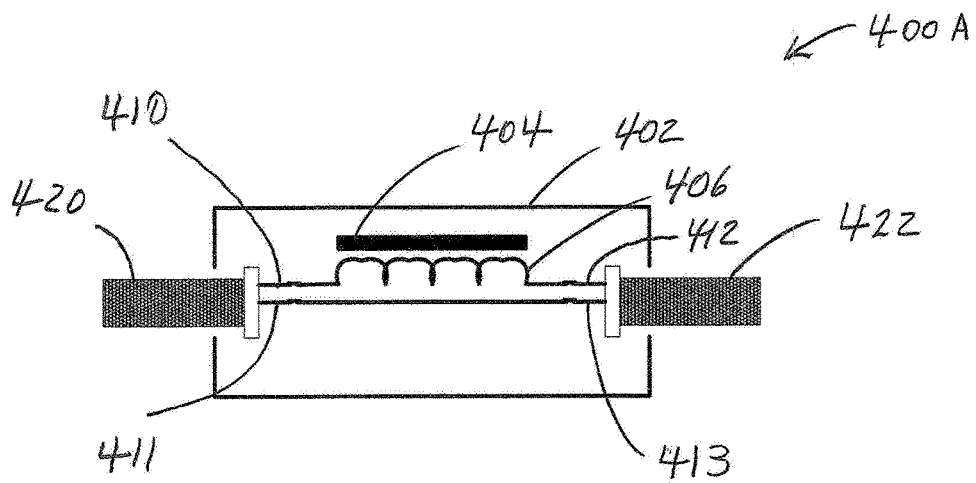
FIG. 4A shows an auxiliary filtering device for filtering coaxial shield noise for use in the cable distribution plant of FIG. 3.
Figure 4B:
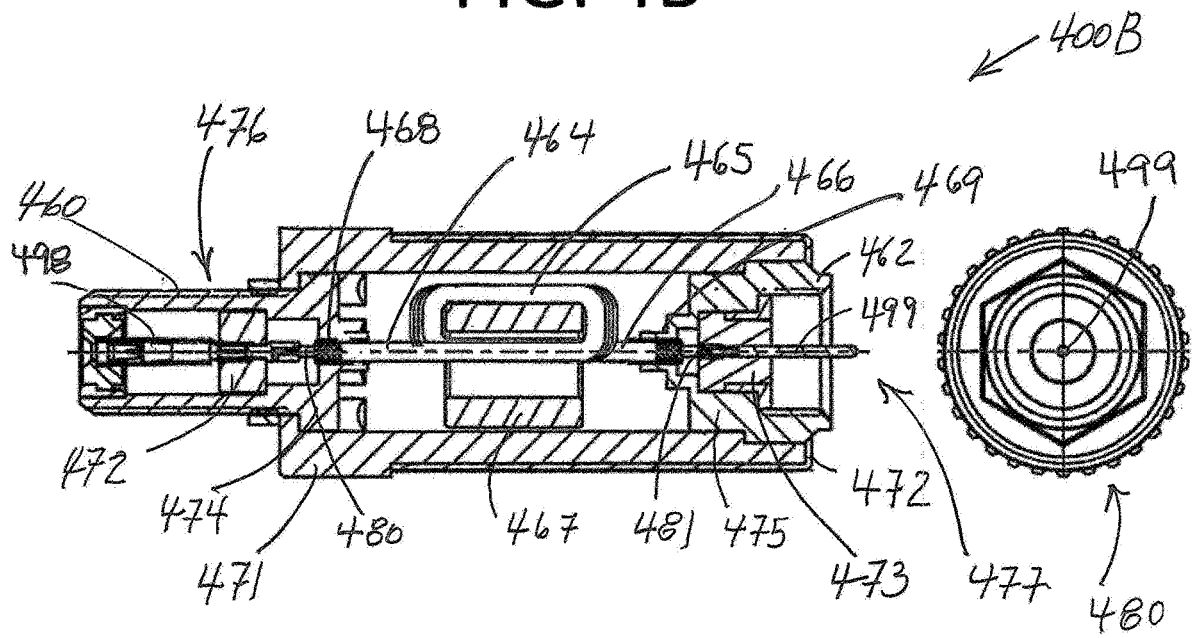
FIG. 4B a cross-sectional view of an embodiment of the filter of FIG. 4A.
Figure 4C:
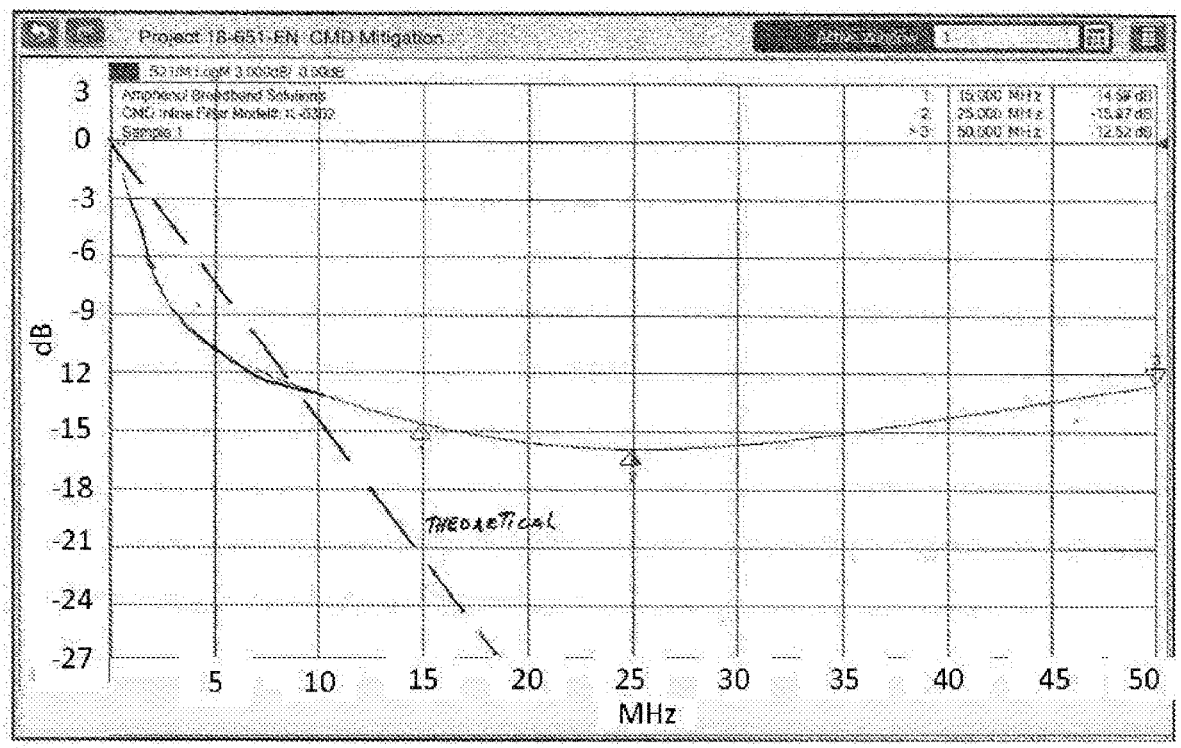
FIG. 4C shows response of an embodiment of the filter of FIG. 4B.

FIGS. 4A-C show a first auxiliary filtering device. As seen in 400A, the device includes a housing 402, an inductor such as a ferrite 404, and an inductor wire 406 coiled around the inductor 404. The inductor wire may interconnect the shields 410, 412 of coaxial devices, may interconnect the center conductors 411, 413 of the coaxial devices, or may interconnect both the shields and the center conductors of coaxial devices where coaxial devices include coaxial cables and coaxial connectors.

In various embodiments, the auxiliary filtering device 400A includes coaxial cable connections 420, 422 such as male-male, female-female, and male-female connections. The connections may be F-Type coaxial connections such as a male connection with a central pin 499 for attachment to a modem and a female connection with a seizing pin 498 for attachment to a coaxial cable terminated with a male connector.

In an embodiment the inductor wire 406 is a coaxial cable interconnecting both the shield conductor and center conductor of a first coaxial devices with that of a second coaxial device. In an embodiment the inductor wire 406 is a micro-coaxial cable. Micro-coaxial cable outside diameters may vary from less than 1 mm to 2.5 mm. Micro coaxial cable outside diameter may be about 1.5 mm. In some embodiments the micro coaxial cable impedance is 75 ohms.

Tolerances here and elsewhere in this patent specification are plus or minus manufacturing tolerances, unit conversion tolerances, and measurement tolerances.

The inductor wire may pass through and/or be coiled around the inductor and the inductor may be an open or closed loop such as a closed loop in the form of a toroid or shield bead.

For some embodiments of a ferrite bead or toroid, the impedance measured in Ohms varies from 20 to 90 Ohms and in some embodiments may be 28 Ohms at 10 MHz (+/−5 MHz), 45 Ohms at 25 MHz (+/−5 MHz), and 68 Ohms at 100 MHz (+/−5 MHz). In an embodiment impedance varies from about 28 Ohms to about 68 Ohms over a range of 10 MHz to 100 MHz.

For some embodiments where micro-coaxial cable is coiled on a ferrite toroid, at 5, 15, 25, and 50 MHZ for respective attenuations of 10, 14, 16, 13 dB respective reactances are 167, 300, 308, 263 ohms, and respective inductances are 5, 3.2, 1.9, 0.8 uh.

In an embodiment a micro-coaxial cable is coiled around a shield bead such that the inductor wire enters the bead passage 2 to 7 times.

FIG. 4B shows a cross-sectional drawing of a version of the first auxiliary filtering device 400B. Within a housing 471 which may or may not have a metal shroud 472 is a toroidal structure 467 about which a micro-coaxial cable 465 is coiled. One end of the filter 476 includes a female F-Type connector 460 and another end of the filter 477 includes a male F-Type connector 462.

At the female connector end of the filter 476 the micro-coaxial cable end 464 is terminated 1) with the shield 468 in a first conductive sleeve including external port threads 474 and 2) with the center conductor 480 in a coaxial sleeve insulator 472 located inside the first conductive sleeve.

At the male connector end of the filter 477 the micro-coaxial cable end 466 is terminated 1) with the shield 469 in a second conductive sleeve including internal connector threads 462 and 2) with the center conductor 481 in a coaxial sleeve insulator 473 located inside the second conductive sleeve. The shroud 472 may be electrically interconnected with the male connector 462.

At the right of the figure is an end view of the filter 480. This view is taken from the male connector end 477. Use of micro-coaxial cable 465 permits the outside diameter of the filter 400B to be less than 20 mm and the length of the filter to be less than 58 mm.

Reduced shielding available for micro-coaxial cables may require a metal shroud 472 and the shroud may be electrically interconnected with a coaxial device shield such as that of a male coaxial connector. Further, use of micro-coaxial cable may influence the permeability and/or the impedance specification of the inductor 467.

Micro-coaxial cable construction may include a center conductor, a dielectric around the center conductor, an aluminum foil shield and/or a metallic wire braid with an outer polymer jacket such as a PVC jacket. The micro-coaxial cable may have an impedance of 75 Ohms. Use of foil and braid shields (dual shields) provides additional center conductor shielding.

FIG. 4C shows frequency response of an auxiliary filtering device. This particular filter utilizes a single coil of dual shield 1.5 mm 75 Ohm micro-coaxial cable about a shield bead having an impedance that varies from about 28 Ohms to about 68 Ohms over a range of 10 MHz to 100 MHz. In particular, it is seen that filter response is (0 dB) below 1 MHz and (−16 dB) at about 25 MHz afterwhich filter response changes to about −13 dB at about 50 MHz. As discussed earlier, this range of frequency response from about 6 MHz to about 30 MHz protects the head end 118 from noise in the form of harmonics emanating from the switching power supply 234.

In some embodiments capacitive effects owing to use of micro-coaxial cable and or micro-coaxial cable coiled around a ferrite such as the indicated micro-coaxial cable 406 and/or ferrite 404 result in filter response that is about flat between 15 and 35 MHz.

Figure 5A:
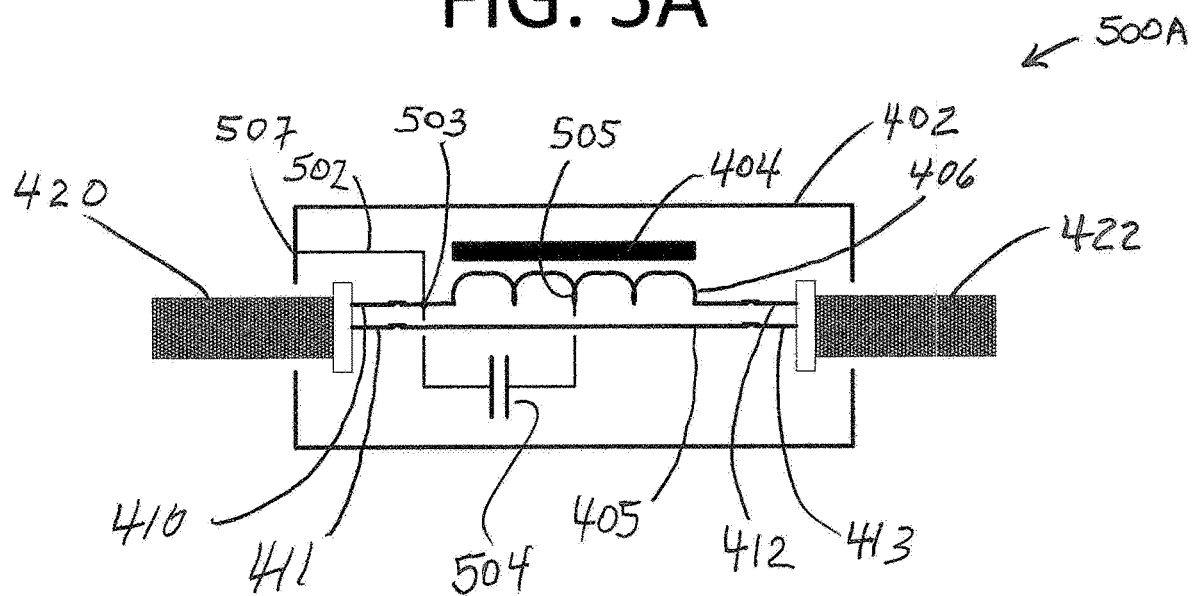
FIG. 5A shows another auxiliary filtering device for filtering coaxial shield noise for use in the cable distribution plant of FIG. 3.
Figure 5B:
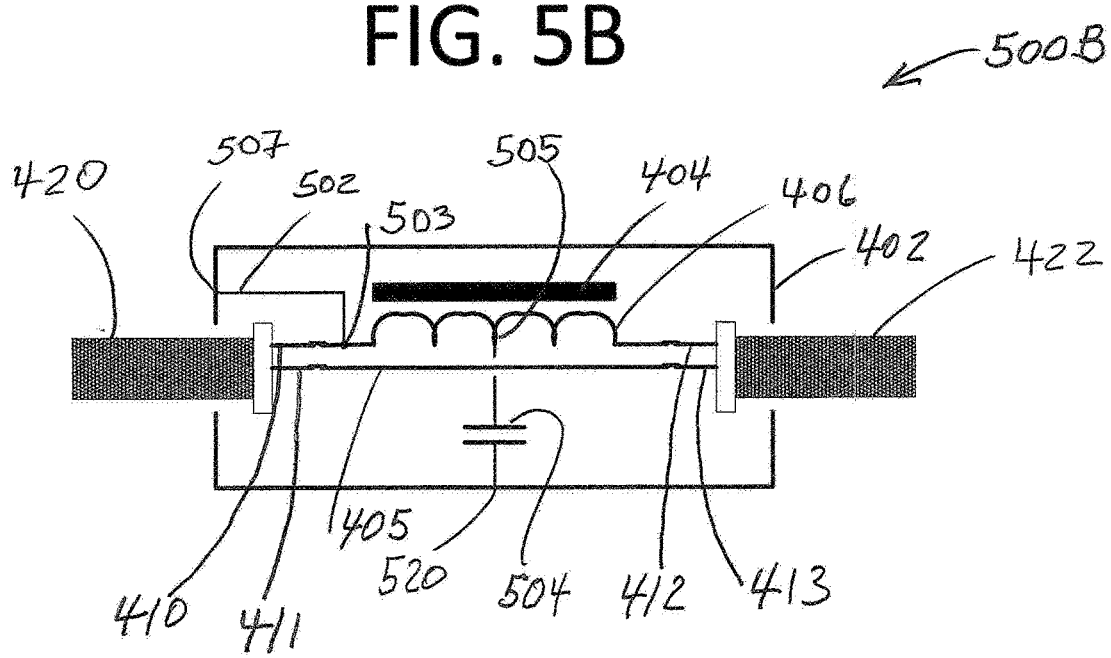
FIG. 5B shows yet another auxiliary filtering device for filtering coaxial shield noise for use in the cable distribution plant of FIG. 3.

FIGS. 5A-B show auxiliary filtering device 500A-B. Like the device of FIG. 4A, these devices condition the signal on a coaxial cable shield or ground conductor.

The filter of FIG. 5A is similar to the filter of FIG. 4A. In particular, the FIG. 5A filter includes a metallic filter enclosure 402 and within the enclosure an inductor wire 406 coiled around an inductor such as a ferrite or ferrite toroid 404. Coaxial devices at opposed ends of the filter 420, 422 include respective shields 410, 412 and center conductors 411, 413 with the center conductors interconnected by a wire 405 and the shield conductors interconnected by the inductor wire. In various embodiments, the coaxial devices 420, 422 may be coaxial cable connections such as F-Type coaxial connections and may be as male-male, female-female, and male-female connections.

The filter of FIG. 5A includes features that may not be found in FIG. 4A. In particular, the FIG. 5A filter may, as shown, include an electrical connection/wire 502 between the enclosure 507 and the shield of a connector 503 such as connector 420. In some embodiments connector 420 is attached/connected to the modem 120. Further, this filter may include a capacitor 504 connected at one end to the inductor wire 505 and connected at the other end to the connector shield 503. This embodiment obviously provides an LC (inductor-capacitor) filter. Capacitor values may vary between 10 and 5000 pf. Capacitor values may vary between 100 and 1000 pf. Capacitor values may vary from 200 to 500 pf. A capacitor value of about 330 pf may provide a notch around 20 MHz when attached on a third winding of an inductor wire in a filter with four windings on a toroid.

The filter of FIG. 5B is similar to the filter of FIG. 5A. In particular, the FIG. 5B filter includes a metallic filter enclosure 402 and within the enclosure an inductor wire 406 coiled around an inductor such as a ferrite or ferrite toroid 404. Coaxial devices at opposed ends of the filter 420, 422 include respective shields 410, 412 and center conductors 411, 413 with the center conductors interconnected by a wire 405 and the shield conductors interconnected by the inductor wire.

While the capacitor of FIG. 5A was located between the inductor wire 505 and the shield 503, the capacitor of FIG. 5B is located between the inductor wire 505 and the enclosure 520. This arrangement removes the connection between the shield 503 and the capacitor 504 and replaces it with a connection between the enclosure 402 and the capacitor 520. Again, this arrangement provides yet another LC (inductor-capacitor) filter.

Figure 6A:
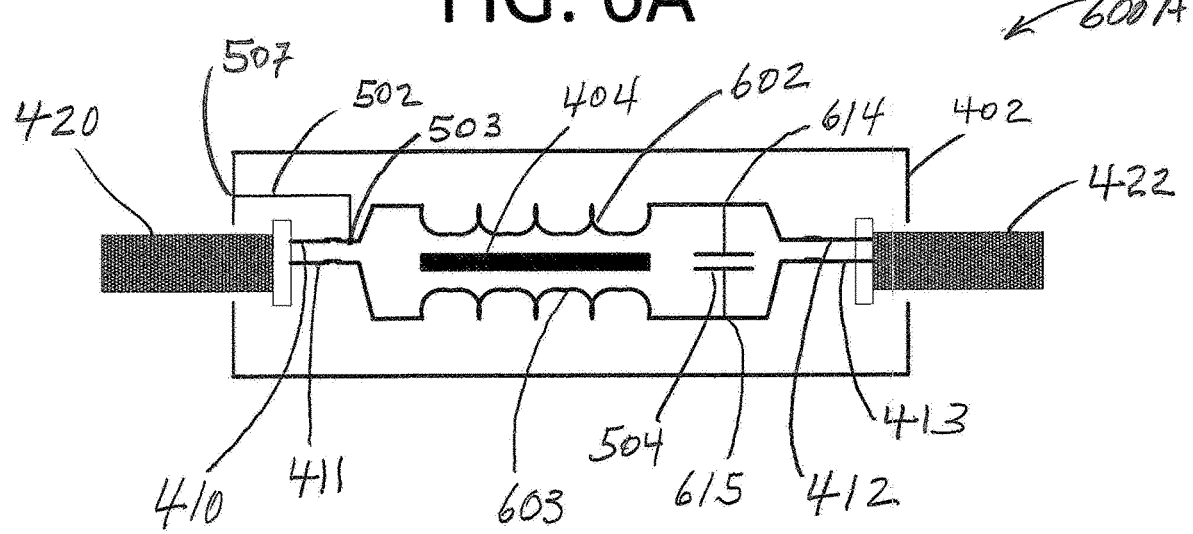
FIG. 6A shows an auxiliary filtering device for filtering coaxial shield noise and coaxial center conductor noise for use in the cable distribution plant of FIG. 3.
Figure 6B:
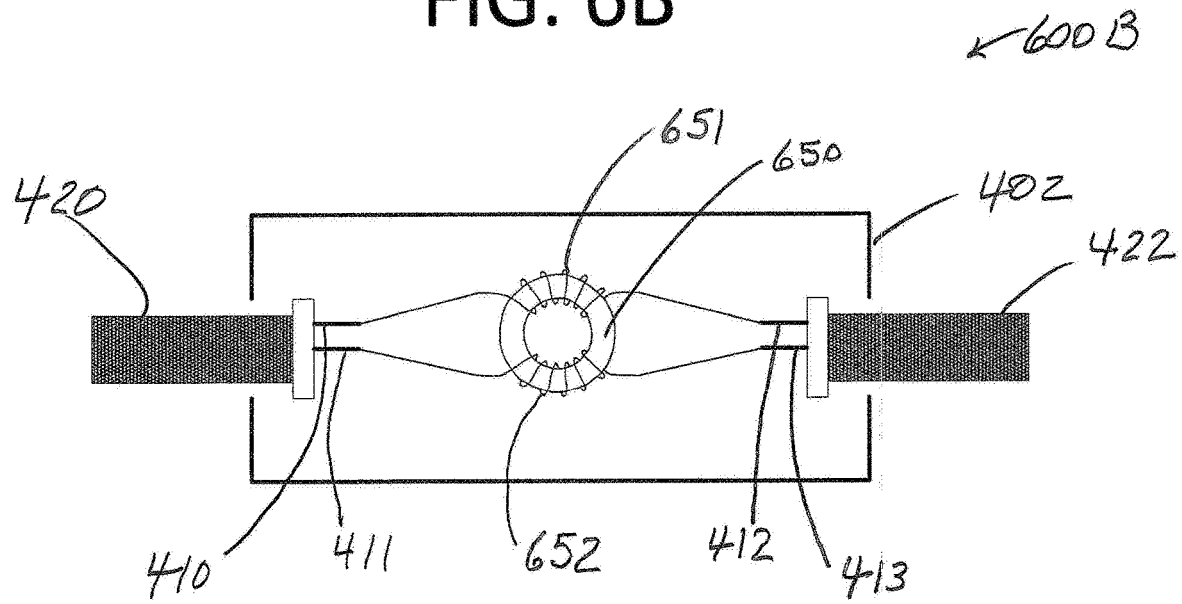
FIG. 6B shows another auxiliary filtering device for filtering coaxial shield noise and coaxial center conductor noise for use in the cable distribution plant of FIG. 3.

FIG. 6A-B show auxiliary filtering devices 600A-B. Unlike the filters of FIGS. 4A,B and FIGS. 5A,B, the filters of FIG. 6A-B condition signals on both a coaxial shield and a coaxial cable center conductor.

The filter of FIG. 6A is somewhat similar to the filters of FIG. 5A-B. In the filter of FIG. 6A, a filter enclosure 402 covers a first inductor wire 602 coiled around an inductor such as a ferrite or ferrite toroid 404. Coaxial devices at opposed ends of the filter 420, 422 include respective shields 410, 412 and the inductor wire 602 completes the circuit between the shields. A second inductor wire 603 is also coiled around the inductor and in some embodiments the inductor is coiled in a direction opposite that of the first inductor. The second inductor completes the circuit between the center conductors 411, 413 of the coaxial devices 420, 422. In various embodiments, the coaxial devices 420, 422 may be coaxial cable connections such as F-Type coaxial connections and may be as male-male, female-female, and male-female connections.

In addition to the first and second inductor wires 602, 604, the filter of FIG. 6A includes a capacitor 504, One end of this capacitor is connected 614 to the shield of connector device 422 and the other end of the capacitor is connected 615 to the center conductor of conductor device 422.

This arrangement provides an LC (inductor-capacitor) filter that conditions the signal on each of the shield and the center conductor. In various embodiments using oppositely wound inductor wires 602, 603 this filter cancels out or attenuates shield signals that are simultaneously repeated on the center conductor.

FIG. 6B shows a filter similar to that of FIG. 6A. In the figure a toroidal ferrite 650 having two windings is shown in a filter enclosure 402. A first winding 651 wound in a first direction interconnects the shields 410, 412 of coaxial devices 420, 422. A second winding 652 interconnects the center conductors 411, 413 of coaxial devices 420, 422.

In FIGS. 4A, 4B, 5A, 5B, 6A, 6B various embodiments provide for the shield 410 of connector 420 to be connected to a metallic enclosure 402. The metallic enclosure may be wrapped around one end or wrapped around both ends of the connector. The shield may be connected to the metallic enclosure at one end of the metallic enclosure or at both ends of the metallic enclosure. And, in these same figures, various embodiments provide for the shield of connectors 420, 421 to be disconnected from the metallic enclosure 402.

Figure 7:
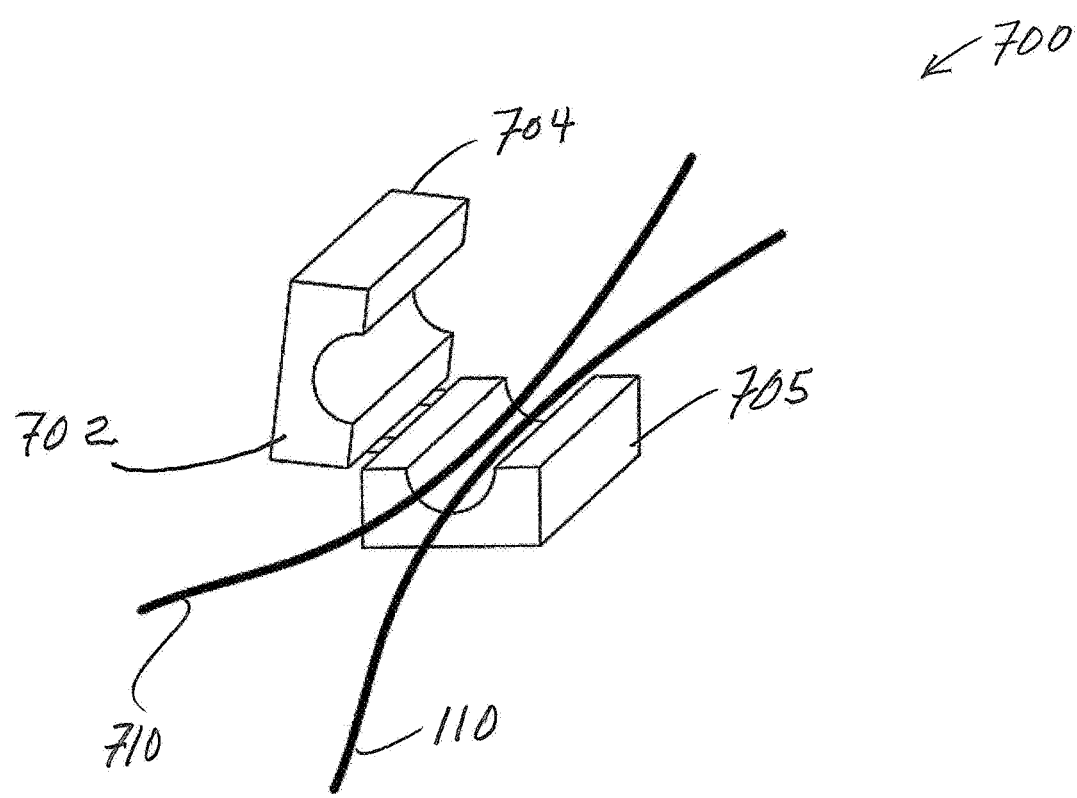
FIG. 7 shows a ferrite for surrounding a modem power cable and a modem coaxial cable for filtering noise on a coaxial shield for use in the cable distribution plant of FIG. 3 in lieu of the inline filtering device shown.

FIG. 7 shows a two cable filtering solution 700. Here, a modem mains power cable (120 VAC) 710 and a modem coaxial cable 110 are passed through a ferrite loop such as a split 704, 705 toroid 702. When closed the split torroid provides a continuous magnetic path around the coaxial and power conductors. In this filter, noise on the coaxial shield and to a lesser extent noise on the coaxial center conductor is injected into the power cord.

Figure 8A:
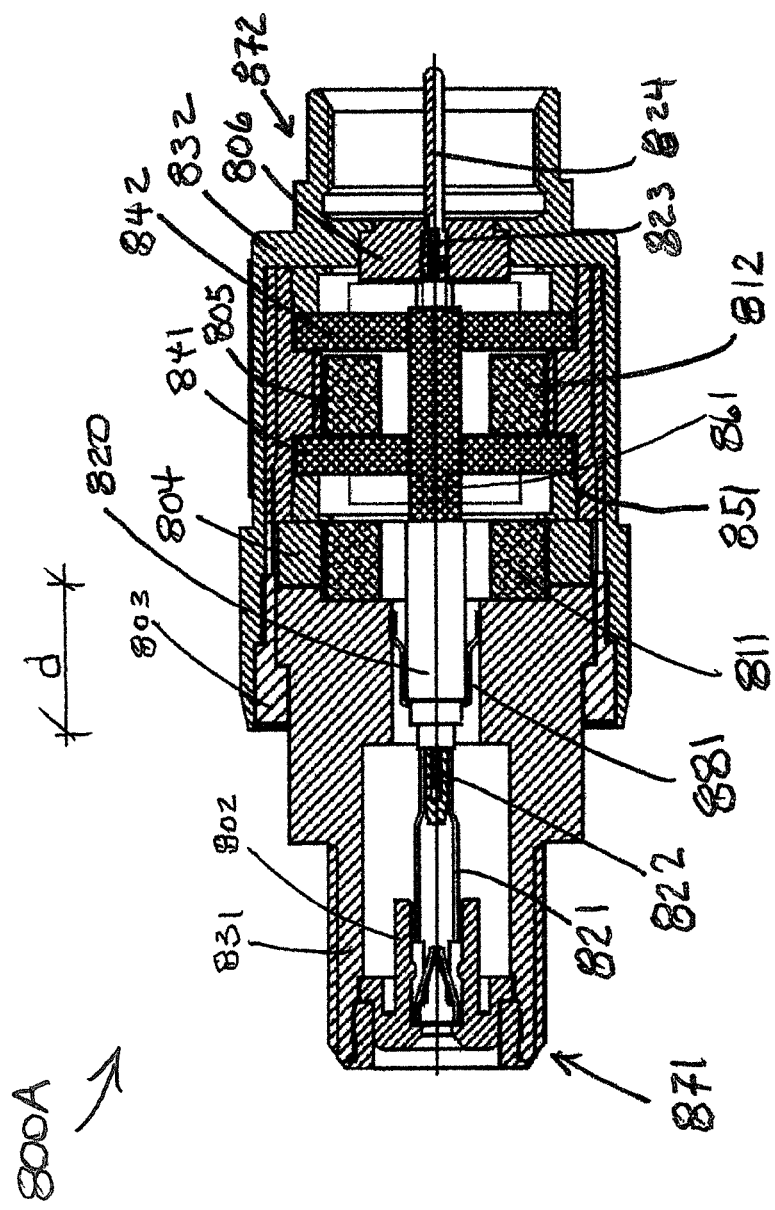
FIG. 8A-B show an isolating filter and its printed circuit boards used as an auxiliary filtering device for filtering noise on a coaxial shield for use in the cable distribution plant of FIG. 3.
Figure 8A:
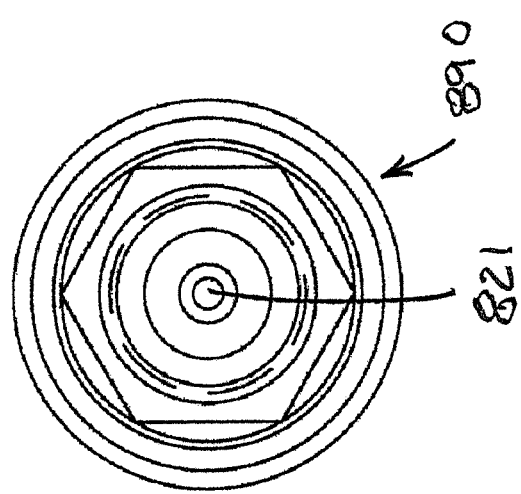
Figure 8B:
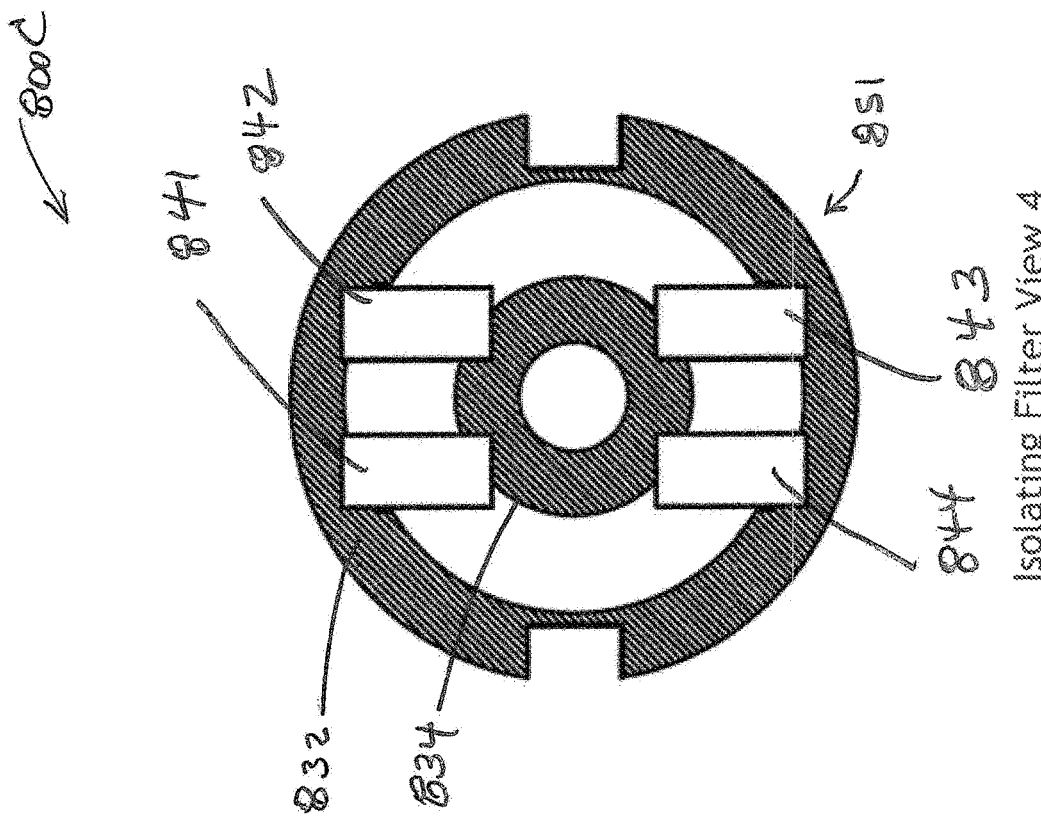
Figure 8C:
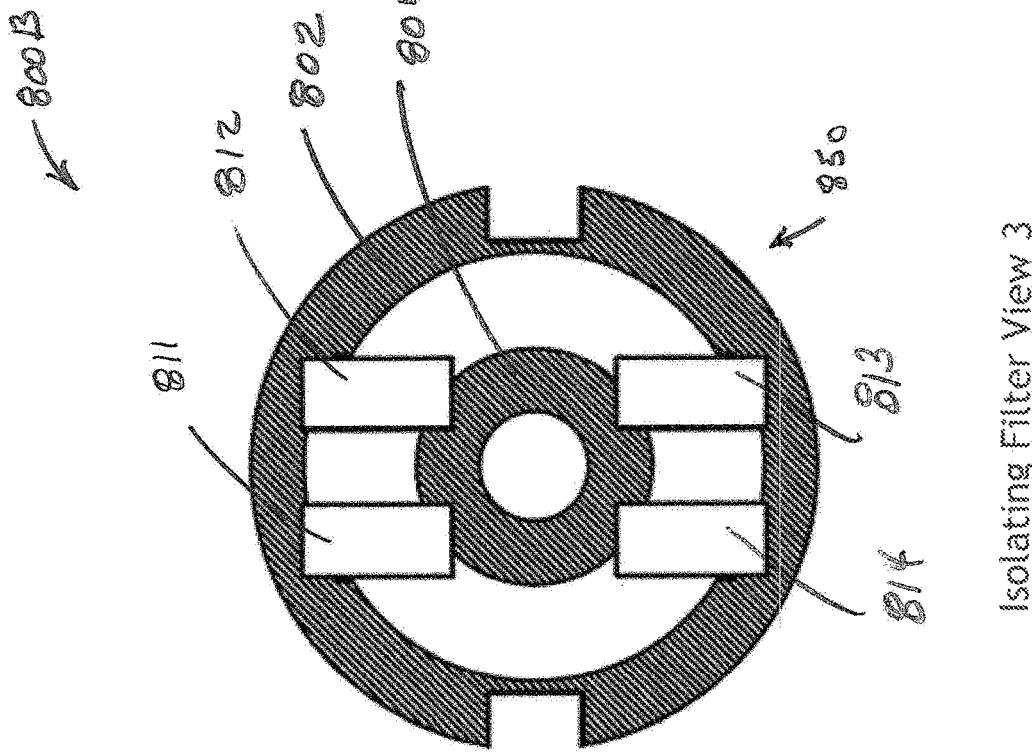
FIG. 8C shows a response curve for a selected filter.

FIGS. 8A-C show an isolating filter and its printed circuit boards 800A-C. In various embodiments the filter may be made with a maximum outer diameter of less than 16 mm and a maximum length of less than 43 mm.

FIG. 8A shows the isolating filter 800A. A male F-Type connector 872 is at one end and a female F-Type connector 871 is at an opposite end. In the figure, 802-806 are insulators and 811-812 are ferrites. In the figure 820 is a coaxial cable such as an RG-179 coaxial cable and 861 is a shield of the coaxial cable 820. In the figure 821-824 are center conductors where 821 is an F-Type female connector seizing pin and 822-823 are coaxial cable center conductors and 824 is a male F-Type connector center pin. In the figure 831 is an inner metal shell and 832 is an outer metal shell. In the figure 841 and 842 are printed circuit boards. In the figure 851 is a metallic and/or plated metal (e.g., zinc, nickel or similar) bridge interconnecting the outer traces of the printed circuit boards. In various embodiments, the coaxial connectors 871, 872 may be coaxial cable connections such as F-Type coaxial connections and may be as male-male, female-female, and male-female connections.

The center conductors of this isolating filter 821-824 pass a center conductor signal through the filter without attenuating or otherwise affecting the signal. However, the signal on the shield of the coaxial cable 861 is processed through devices including a high pass filter.

The signal reaches the coaxial cable braid/shield 861 when it is conducted by the female end 871 inner shell 831 to the coaxial cable braid by a conductor or clip 881 extending therebetween the braid and the inner shell. The coaxial cable then passes through a first ferrite 811. And, beyond this ferrite the signal is passed to a first printed circuit board 841 via the coaxial cable braid 861.

FIG. 8B shows the first printed circuit board ("PCB") 800B. The PCB has nested cylindrical or looped traces, one 804 inside the other 802. The coaxial cable braid 861 is soldered to the inner trace of this PCB. Capacitors 811, 813 and resistors 812, 814 interconnect the two traces. Notably, the capacitors and resistors may be more or less numerous and they may be arranged in any order.

FIG. 8C shows a second PCB 800C. The PCB has nested cylindrical or looped traces, one 834 inside the other 832. The coaxial cable braid 861 is again soldered to the inner trace 834 of the second PCB. Capacitors 841, 843 and resistors 842, 844 interconnect the two traces. Notably, the capacitors and resistors may be more or less numerous and they may be arranged in any order.

Total resistance across the traces of the first and second PCB's 850, 851 may vary from about 10 to 1000 Ohms or may be less that about ⁻100 Ohms. Total capacitance across the traces of the first and second PCB's may vary from about 10 to 1000 pf or may be less than about 100 pf. Between the two PCB's is a second ferrite 812 through which the coaxial cable 861 passes.

The signal leaves the first PCB inner trace 804 and moves via the resistor(s) and capacitor(s) to the outer trace 802 where the zinc bridge 851 interconnects the outer trace of the first PCB 802 with the outer trace of the second PCB 832. The second PCB outer trace is connected to the male end 872 outer shell 832.

In parallel with this signal path via the coaxial cable braid 861 is a second signal path interconnecting the inner shell 831 and outer shell 832. This second signal path comprises a capacitor created by an overlap "d" created where the inner shell 831 is inserted in the outer shell 832. In various embodiments the resulting capacitance is about 100 to 3000 pf and in some embodiments the capacitance is about 1500 to 1900 pf.

With the auxiliary filtering devices of FIGS. 4A-B, 5A-B, and 6A-B, use of micro coaxial cable may enable construction of a relatively small filter with a maximum diameter of less than 19.3 mm and a maximum length of less than 57.5 mm. Where a male end of the filtering device will be screwed onto a female modem port at the rear of the modem, small filter size is desirable to hide the filter from view and to reduce modem stand-off distance required by filter length. In addition, modem labels near the modem port can be hidden by filters having diameters larger than 19.3 mm.

With the auxiliary filtering device of FIG. 7, the toroidal clam shell 700 is closed around the AC power cable and the modem coaxial cable which enables the filter to be placed conveniently out of sight and away from the modem port at the rear of the modem.

And, with the isolating filter of FIG. 8A, use of small PCB's enables construction of a relatively small filter with a maximum diameter of less than 16 mm and in some embodiments less than 19.3 mm. The maximum length of this filter is less than 43 mm.

While various embodiments of the present invention have been described above, it should be understood that they have been presented by way of example only, and not limitation. It will be apparent to those skilled in the art that various changes in the form and details can be made without departing from the spirit and scope of the invention. As such, the breadth and scope of the present invention should not be limited by the above-described exemplary embodiments, but should be defined only in accordance with the following claims and equivalents thereof.

What is claimed is:

1. A cable distribution system with devices for attenuating noise propagating upstream from multiple subscriber sites toward a head end, the noise attenuating devices including distributed cable modem filters, the cable distribution system comprising:

plural subscriber sites in one of the multiple subscriber sites served by a node of the cable distribution system and plural nodes served by the head end of the cable distribution system;

each subscriber site including a cable modem obtaining power from an alternate current (AC) main power supply interconnected with the node via a coaxial cable and each of the plural nodes interconnected with the head end via an optical fiber, wherein the cable modem comprises:
    a modem transceiver receiving a broadcast signal originating from the cable distribution system and transmitting a signal to one of a television front end and a computer within the subscriber site;
    a switching power supply receiving AC mains power from the AC main power source supply via an electromagnetic interference (EMI) filter; and
    digital electronics receiving a switching direct current (DC) power supply output from the switching power supply via an inductive and capacitive (LC) filter for filtering noise at a switching power supply frequency; and
    a filtering device for filtering noise at harmonics of the switching power supply frequency, wherein the noise at harmonics is carried by one or both of a coaxial shield and a coaxial center conductor of the coaxial cable, wherein filtering devices are used with respective modems at the plural subscriber sites to protect the head end from switching power supply harmonic noise otherwise aggregated by the plural nodes and passed to the head end.

2. The system of claim 1 wherein the filtering device comprises a micro-coaxial cable coiled around a ferrite in the form of a toroid.

3. The system of claim 2 wherein the filtering device further comprises a conductive sleeve around the micro-coaxial cable and the ferrite, the conductive sleeve electrically isolated from coaxial connectors at opposite ends of the filtering device.

4. The system of claim 2 wherein the filtering device further comprises a conductive sleeve around the micro-coaxial cable and the ferrite, the conductive sleeve contacting a coaxial connector at one end of the filtering device but disconnected from a coaxial connector at the other end of the filtering device.

5. The system of claim 2 wherein the micro-coaxial cable includes a dielectric around a center conductor having a braid shield and a foil shield.

6. The system of claim 5 wherein an outside diameter of the micro-coaxial cable is about 1.5 millimeter (MM) and capacitive effects owing to use of the micro-coaxial cable coiled around the ferrite contribute to a response of the filtering device that is about flat between 15 and 35 MHz.

7. The system of claim 6 wherein the micro-coaxial cable permits the outer diameter of the filtering device to be less than 20 mm and the length of the filtering device to be less than 58 mm.

8. The system of claim 5 wherein the filtering device further comprises a capacitor connected between a conductive sleeve and a micro-coaxial cable shield where the micro-coaxial cable is coiled around the ferrite.

9. The system of claim 8 wherein the filtering device is for extending from a cable modem port at the rear of the cable modem and a filter size does not obstruct a label adjacent to the cable modem port.

10. The system of claim 9 wherein the length of the filtering device is determined in part by a coaxial cable diameter and use of the micro-coaxial cable with an outer diameter of about 1.5 mm results in a filter maximum length of about 58 mm.

11. The system of claim 8 wherein the length of the filtering device is for extending from a cable modem port at the rear of the cable modem and a modem stand-off distance is reduced based on the use of the micro-coaxial cable.

12. The system of claim 11 wherein the response of the filtering device provides about −13 dB attenuation at about 50 MHz.

13. The system of claim 1 wherein the filtering device includes input and output coaxial connectors and interconnecting circuitry therebetween that includes a first winding wound in a first direction on a toroidal ferrite core and a second winding wound in a direction opposite the first direction on the toroidal ferrite core.

14. The system of claim 1 wherein the filtering device includes a ferrite loop in the form of a split toroid through which signals on an AC mains power cable and a modem coaxial cable are passed.

15. The system of claim 1 wherein the filtering device includes input and output coaxial connectors and interconnecting circuitry therebetween, connector center conductors interconnected via a coaxial cable center conductor that passes through first and second toroidal ferrites with a first circuit board therebetween and a connector shield conductor interconnection including 1) resistors and capacitors that populate the first circuit board and a second circuit board and 2) a capacitor created by an overlap between a connector inner metallic shell and a connector outer metallic shell.

* * * * *